(12) United States Patent
Deng et al.

(10) Patent No.: US 10,804,188 B2
(45) Date of Patent: Oct. 13, 2020

(54) ELECTRONIC DEVICE INCLUDING A LATERAL TRACE

(71) Applicant: Intel Corporation, Santa Clara, CA (US)

(72) Inventors: Yikang Deng, Chandler, AZ (US); Ying Wang, Chandler, AZ (US); Cheng Xu, Chandler, AZ (US); Chong Zhang, Chandler, AZ (US); Junnan Zhao, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/124,838

(22) Filed: Sep. 7, 2018

(65) Prior Publication Data

US 2020/0083153 A1 Mar. 12, 2020

(51) Int. Cl.
*H01L 23/498* (2006.01)
*H01L 23/538* (2006.01)

(52) U.S. Cl.
CPC .... *H01L 23/49822* (2013.01); *H01L 23/5383* (2013.01)

(58) Field of Classification Search
CPC ............. H01L 23/49822; H01L 23/5383
See application file for complete search history.

(56) References Cited

U.S. PATENT DOCUMENTS

| | | | | |
|---|---|---|---|---|
| 4,539,622 A | * | 9/1985 | Akasaki | H01L 23/057 156/89.21 |
| 4,663,215 A | * | 5/1987 | Dubuisson | H01L 23/15 428/209 |
| 4,770,922 A | * | 9/1988 | Hatakeyama | B32B 5/16 428/211.1 |
| 4,829,666 A | * | 5/1989 | Haghiri-Tehrani | G06K 19/07745 29/841 |
| 4,905,075 A | * | 2/1990 | Temple | G02B 6/4204 174/50.5 |
| 5,041,899 A | * | 8/1991 | Oku | H01L 23/057 257/691 |
| 5,293,069 A | * | 3/1994 | Kato | H01L 23/04 257/698 |
| 5,294,750 A | * | 3/1994 | Sakai | H01L 23/15 174/548 |
| 5,521,332 A | * | 5/1996 | Shikata | H01L 23/13 174/521 |
| 5,554,824 A | * | 9/1996 | Ueda | H01L 21/485 174/538 |
| 5,562,971 A | * | 10/1996 | Tsuru | H01L 21/4857 428/209 |
| 5,578,796 A | * | 11/1996 | Bhatt | H01L 21/4807 174/252 |

(Continued)

*Primary Examiner* — Victoria K. Hall
(74) *Attorney, Agent, or Firm* — Schwegman Lundberg & Woessner, P.A.

(57) ABSTRACT

An electronic device may include a substrate, and the substrate may include one or more layers. The one or more layers may include a first dielectric material and one or more electrical traces. A cavity may be defined in the substrate, and the cavity may be adapted to receive one or more electrical components. One or more lateral traces may extend through a wall of the cavity. The lateral traces may provide electrical communication pathways between the substrate and the electrical components.

9 Claims, 6 Drawing Sheets

(56) References Cited

U.S. PATENT DOCUMENTS

| | | | | |
|---|---|---|---|---|
| 5,597,643 A * | 1/1997 | Weber | H01L 21/4857 | 174/255 |
| 5,600,541 A * | 2/1997 | Bone | H01L 23/433 | 257/686 |
| 5,621,190 A * | 4/1997 | Yamasaki | H01L 21/485 | 174/538 |
| 5,625,166 A * | 4/1997 | Natarajan | H01L 23/24 | 174/557 |
| 5,629,559 A * | 5/1997 | Miyahara | H01L 23/057 | 257/666 |
| 5,731,227 A * | 3/1998 | Thomas | H01L 23/49827 | 257/E23.063 |
| 5,828,126 A * | 10/1998 | Thomas | H01L 23/49827 | 257/695 |
| 5,994,771 A * | 11/1999 | Sasaki | H01L 21/4857 | 257/700 |
| 6,324,067 B1 * | 11/2001 | Nishiyama | H05K 1/165 | 174/262 |
| 6,670,751 B2 * | 12/2003 | Song | H01L 33/641 | 257/E25.02 |
| 6,734,535 B1 * | 5/2004 | Hashimoto | H01L 23/13 | 257/668 |
| 8,345,433 B2 * | 1/2013 | White | H01L 21/4857 | 361/761 |
| 10,004,143 B2 * | 6/2018 | Ishihara | H05K 3/4682 | |
| 10,039,184 B2 * | 7/2018 | Wu | H05K 3/0044 | |
| 10,356,901 B2 * | 7/2019 | Wu | H05K 3/4697 | |
| 10,424,561 B2 * | 9/2019 | Lee | H01L 25/105 | |
| 10,475,776 B2 * | 11/2019 | Kim | H01L 24/08 | |
| 10,651,150 B2 * | 5/2020 | Kato | H01L 25/0657 | |
| 2002/0125574 A1 * | 9/2002 | Lautzenhiser | H05K 3/248 | 257/758 |
| 2003/0222344 A1 * | 12/2003 | Hosoyamada | H01L 23/3128 | 257/738 |
| 2004/0089472 A1 * | 5/2004 | Ninomiya | H01L 23/13 | 174/266 |
| 2006/0237225 A1 * | 10/2006 | Kariya | H01L 23/49827 | 174/260 |
| 2008/0049406 A1 * | 2/2008 | Ikezawa | H01L 23/5389 | 361/761 |
| 2008/0206926 A1 * | 8/2008 | Sakamoto | H01L 21/568 | 438/110 |
| 2009/0026604 A1 * | 1/2009 | Shin | H01L 21/4857 | 257/702 |
| 2010/0170700 A1 * | 7/2010 | Nakamura | H05K 1/183 | 174/254 |
| 2010/0295170 A1 * | 11/2010 | Komura | H01L 23/3677 | 257/700 |
| 2010/0320622 A1 * | 12/2010 | Machida | H01L 23/49822 | 257/778 |
| 2013/0194754 A1 * | 8/2013 | Jung | H01L 23/5385 | 361/720 |
| 2014/0035935 A1 * | 2/2014 | Shenoy | H01L 23/15 | 345/501 |
| 2016/0141235 A1 * | 5/2016 | Lin | H01L 23/142 | 361/760 |
| 2016/0218072 A1 * | 7/2016 | Liao | H01L 23/66 | |
| 2016/0322295 A1 * | 11/2016 | Kobayashi | H01L 23/49838 | |
| 2016/0322340 A1 * | 11/2016 | Li | H01L 25/18 | |
| 2016/0358848 A1 * | 12/2016 | Meyer | H01L 23/49822 | |
| 2017/0025383 A1 * | 1/2017 | Kato | H01L 21/4857 | |
| 2017/0040265 A1 * | 2/2017 | Park | H01L 24/19 | |
| 2017/0053878 A1 * | 2/2017 | Kajihara | H01L 21/486 | |
| 2017/0062383 A1 * | 3/2017 | Yee | H01L 25/0652 | |
| 2017/0064835 A1 * | 3/2017 | Ishihara | H05K 3/4682 | |
| 2017/0256478 A1 * | 9/2017 | Sakamoto | H01L 24/76 | |
| 2017/0287871 A1 * | 10/2017 | Lu | H01L 23/24 | |
| 2017/0372980 A1 * | 12/2017 | Kurahashi | H05K 3/4697 | |
| 2018/0145036 A1 * | 5/2018 | Kim, II | H01L 24/20 | |
| 2018/0146554 A1 * | 5/2018 | Kajihara | H05K 3/4638 | |
| 2018/0211926 A1 * | 7/2018 | Jang | H01L 21/565 | |
| 2018/0315721 A1 * | 11/2018 | Sato | H01L 23/49822 | |
| 2019/0051608 A1 * | 2/2019 | Sugiyama | H01L 23/5383 | |
| 2019/0198429 A1 * | 6/2019 | Kang | H01L 23/49541 | |
| 2019/0237406 A1 * | 8/2019 | Choi | H01L 23/562 | |
| 2019/0244885 A1 * | 8/2019 | Kim | H01L 23/49838 | |
| 2019/0279950 A1 * | 9/2019 | Kim, II | H01L 23/5386 | |
| 2019/0333782 A1 * | 10/2019 | Wang | H01L 21/568 | |
| 2019/0333854 A1 * | 10/2019 | Hossain | H01L 23/49822 | |
| 2019/0333861 A1 * | 10/2019 | Pietambaram | H01L 23/5386 | |
| 2020/0066622 A1 * | 2/2020 | Jain | H01G 4/228 | |
| 2020/0075491 A1 * | 3/2020 | Dogiamis | H01L 23/5384 | |

* cited by examiner

ELECTRONIC DEVICE INCLUDING A LATERAL TRACE

BACKGROUND

In some examples, electronic devices include a substrate (e.g., a dielectric material) and the substrate defines a cavity. A laser may remove (e.g., ablate) the substrate material in one or more specified locations to create the cavity in the substrate. A semiconductor die may be positioned in (e.g., recessed within) the cavity. The semiconductor die may include die contacts, and the die contacts may be exposed when the semiconductor die is positioned in the cavity of the substrate. For example, the semiconductor die may be positioned in the cavity and coupled with a surface (e.g., a bottom surface) of the cavity. The die contacts may face away from (e.g., in a direction perpendicular to) the surface of the cavity. The die contacts may be electrically interconnected with additional structures (e.g., a via or an electrical trace).

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present inventors have recognized, among other things, that a problem to be solved may include increasing the density of interconnections between a substrate and an electrical component (e.g., a semiconductor die) that is positioned in a cavity defined in the substrate. The present subject matter may help provide a solution to this problem, such as by providing a lateral trace that extends through a wall of the cavity. The lateral trace facilitates interconnecting one or more portions (e.g., a top side or a bottom side) of the electrical component within a footprint of the cavity. Accordingly, the lateral trace increases the density of electrical interconnections because the lateral trace allows for electrical interconnection within the footprint of the cavity. Further, because the lateral trace extends through a wall of the cavity, the lateral trace provides electrical interconnections in the same layer as the cavity. Accordingly, the number of layers of the substrate needed to interconnect with the electrical component may be reduced because of the increase in the interconnection density within the same layer as the cavity. Conversely, the number of layers of the substrate may remain constant, and the lateral trace facilitates the repurposing of the portions of the substrate that are no longer needed to electrically interconnect with electrical component. Accordingly, the performance of the electronic device is improved because of the increase interconnection density within the same layer as the cavity in the substrate.

An electronic device may include a substrate, and the substrate may include one or more layers. The one or more layers may include a first dielectric material and one or more electrical traces. A cavity may be defined in the substrate, and the cavity may be adapted to receive one or more electrical components. One or more lateral traces may extend through a wall of the cavity. The lateral traces may provide electrical communication pathways between the substrate and the electrical components.

Figure 1:
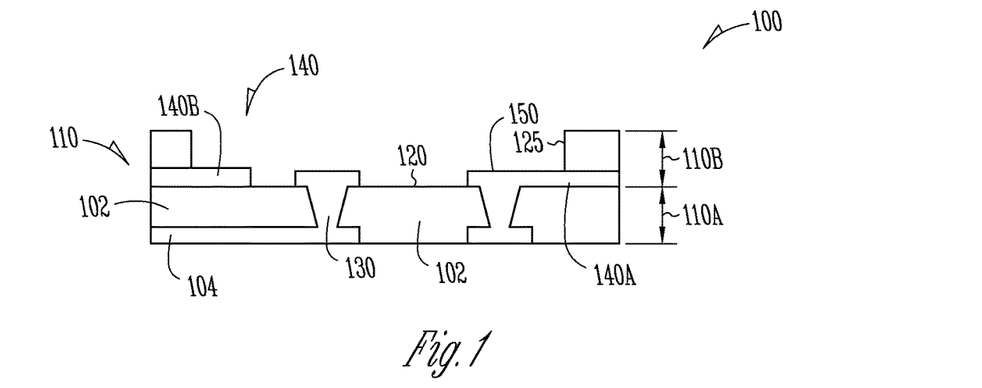
FIG. 1 is a detailed schematic view of one example of a substrate.

FIG. 1 is a detailed schematic view of one example of a substrate 100. The substrate 100 includes a plurality of layers 110, and a cavity 120 defined in the substrate 100. In an example, the substrate 100 may include a first layer 110A and a second layer 110B. In one example, the plurality of layers 110 are built up successively to form the substrate 100. For instance, the first layer 110A may include a dielectric material 102 and one or more electrical traces 104. The second layer 110B may include additional dielectric material 102 and electrical traces 104, and the second layer 110B may be coupled to the first layer 110A. The electrical traces 104 may facilitate the transmission of one or more electrical signals within the first layer 110A or the second layer 110B. One or more vias 130 may electrically interconnect the first layer 110A with the second layer 110B. For example, the via 130 may facilitate the transmission of one or more electrical signals between the first layer 110A and the second layer 110B.

As previously described herein, the cavity 120 is defined in the substrate 100 For instance, the second layer 110B may include the cavity 120. In an example, a laser is utilized to remove material from the substrate 100 (e.g., by ablating the dielectric material 102). The removal of the material from the substrate 110 by the laser forms the cavity 120. In another example, the cavity 120 is formed by mechanically removing the material from the substrate 100 (e.g., removing the material with a router, mill, or the like). In yet another example, and as described in greater detail herein, the cavity 120 may be formed with other manufacturing operations (e.g., one or more of the manufacturing operations described with reference to FIGS. 3-11).

The substrate 100 includes one or more lateral traces 140, for instance a first lateral trace 140A and a second lateral trace 140B. The lateral traces 140 may extend through a wall 125 of the cavity 120. In an example, and as shown in FIG. 1, the first lateral trace 140A and the second lateral trace 140B extend through opposing walls 125 of the cavity 120. The lateral traces 140 may be included in the same layer as the cavity 120. For instance, and as shown in FIG. 1, the lateral traces 140A, 140B and the cavity 120 are included in the second layer 110B of the substrate 100. Accordingly, the lateral traces 140A, 140B extend into the cavity 120 through the walls 125 of the cavity.

The lateral traces 140 provide an electrical communication pathway within a footprint of the cavity 120 and facilitate the electrical interconnection with the substrate 110 inside the cavity 120. For example, and as described in greater detail herein, the lateral traces 140 may be in electrical communication with a pad 150.

Figure 2:
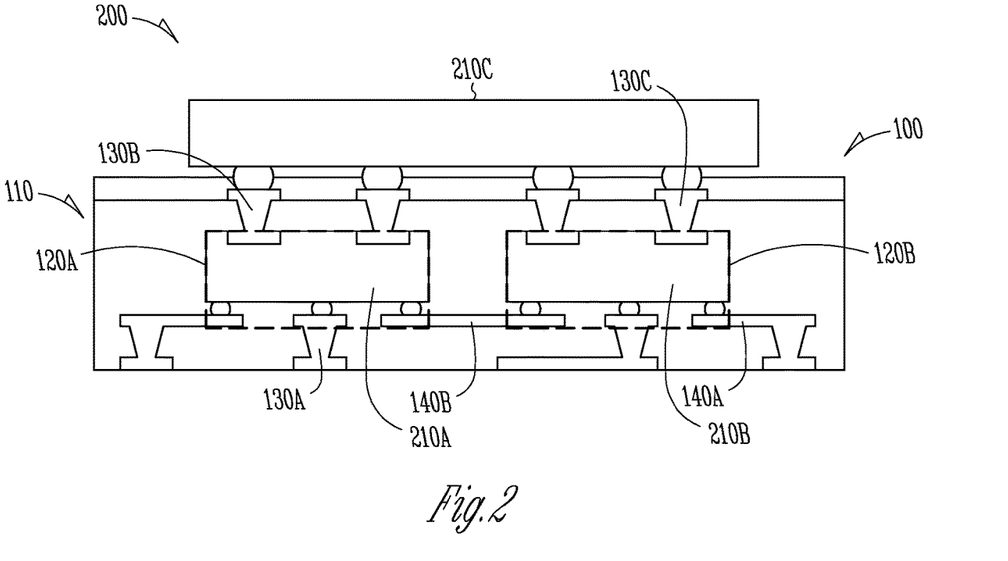
FIG. 2 is schematic view of one example of a first electronic device.

FIG. 2 is schematic view of one example of a first electronic device 200. The electronic device 200 includes the substrate 100 and one or more electrical components 210, for instance a first die 210A and a second die 210B. The one or more electrical components 210 may be positioned in the cavity 120 defined by the substrate 100. The electrical components 210 may include active electrical components (e.g., a semiconductor die, a transistor, or the like) passive electrical components (e.g., a resistor, a capacitor, an inductor, or the like), or an organic substrate.

The lateral traces 140 may be in electrical communication with the electrical components 210, and the lateral traces 140 may facilitate the transmission of one or more electrical signals between the electrical components 210 and the substrate 100. In an example, and as shown in FIG. 2, the second die 210B may be coupled to the first lateral trace 140A and coupled to the second lateral trace 140B, for instance with one or more solder balls. The second lateral trace 140B extends through the wall 125 (shown in FIG. 1) of the cavity 120B, and toward the first die 210A. The second lateral trace 140B may extend through the wall 125 of the cavity 120A and into a footprint of the cavity 120A. Accordingly, the second lateral trace 140B may electrically interconnect the first die 210A with the second die 210B.

The lateral traces 140 allow for interconnection with the electrical components 210 in one or more directions (e.g., horizontally) with respect to the cavity 120. For example, the electronic device 200 may include a first via 130A and a second via 130B. The vias 130A, 130B may be coupled with the die 210A, and the via 130A may extend through (e.g., communicate with, interface with, intersects with, or the like) a first side (e.g., bottom side) of the cavity 120. The via 130B may extend through a second side (e.g., a top side) of the cavity 120A. The second lateral trace 140B may extend through a third side (e.g., a right side) of the cavity 120A. The third side of the cavity 120A may be perpendicular to the first side of the cavity 120A. Accordingly, the lateral traces 140 facilitate the interconnection of the electronic components 210 (that are positioned in the cavity 120) in one or more directions. In this example, because the lateral traces 140 extend through the wall 125 (shown in FIG. 1) of the cavity 120A, the density of interconnects within the footprint of the cavity 120A is increased. Accordingly, the lateral traces 140 allow for increased flexibility in routing electrical signals between the substrate 100 and the electronic components 210.

As described herein, the substrate 100 includes the plurality of layers 110. The electrical components 210 (e.g., the die 210A, 210B) may be positioned in the cavities 120A, 120B and additional layers may be coupled to the substrate 100. The additional layers may cover the electrical components 210 (e.g., embed or encapsulate the components 210 within the substrate 100). In an example, a resistor may be positioned in the cavity 120A, and an inductor may be positioned the cavity 120B. The resistor and inductor may be coupled with the substrate (e.g., the second lateral trace 140B) and additional layers As described herein, the electrical components 210 may be positioned in the cavities 210A, 210B of the substrate. In another example, the electrical components 210 may be coupled to an exterior of the substrate 100. For instance, a third die 210C may be coupled to a surface (e.g., a top surface) of the substrate 100, for instance with one or more solder balls. The third die 210C may be in electrical communication with the first die 210A and the second die 210B through the substrate 100. For example, the third die 210C may in electrical communication with the first die 210A through the via 130B. The third die 210C may be in electrical communication with the second die 120B through the via 130C. The first die 210A and the second die 210B may be positioned within a footprint of the third die 210C. For instance, as shown in FIG. 21 the first die 210A and the second die 210B may be included in a different layer of the substrate 100 than the third die 210C and the first die 210A and the second die 210B may be positioned within the perimeter of the third die 210C.

Figure 3:
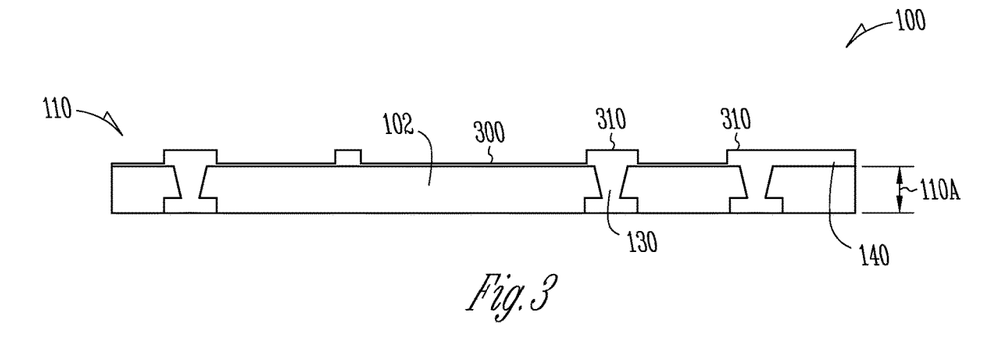
FIG. 3 is a schematic view of the substrate during a manufacturing operation.

FIG. 3 is a schematic view of the substrate 100 during a manufacturing operation. As described herein, the substrate 100 includes the plurality of layers 110, and the plurality of layers 110 include the dielectric material 102 and the electrical traces 104. A layer 300 of conductive material 300 (e.g., copper) may be coupled to the first layer 110A of the substrate 100 (e.g., the dielectric material 102). For instance, the layer 300 of conductive material ("conductive layer 300") may be plated onto the substrate 100.

In an example, the coupling of the conductive layer 300 with the substrate 100 may create the lateral traces 140 or the electrical traces 104. In another example, the coupling of the layer of conductive material 300 to the substrate 100 may form one or more interconnects 310 (e.g., pads, contacts, sockets, or the like). The one or more interconnects 310 may be included in the vias 130 or the lateral traces 140. The one or more interconnects 310 may facilitate the interconnection of the electrical components 210 (shown in FIG. 2) with the substrate 100. In an example, the electrical components 210 (e.g., the first die 210A, shown in FIG. 2) may be coupled to the one or more interconnects 310 and thereby physically and electrically couple the electrical components 210 with the substrate 100. The layer of conductive material 300 may be coupled to the first layer 110A of the substrate 100, and the layer of conductive material 300 may form the lateral traces 140, the electrical traces 104, and the one or more interconnects 310.

Figure 4:
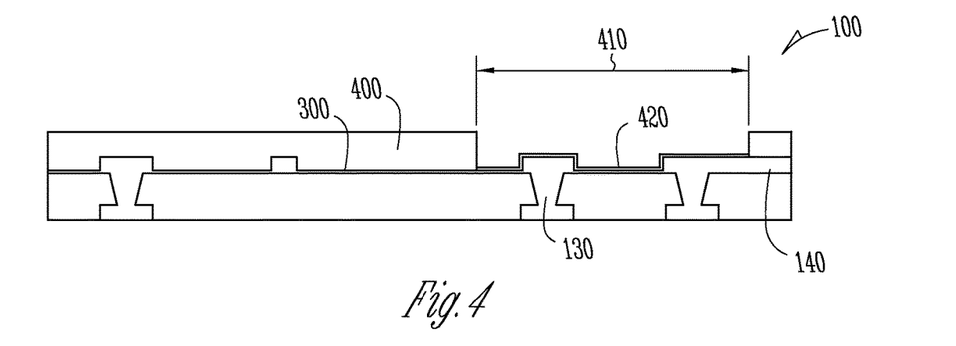
FIG. 4 is a schematic view of the substrate during another manufacturing operation.

FIG. 4 is a schematic view of the substrate 100 during another manufacturing operation. As described herein, the substrate 100 may define a cavity 120 (shown in FIG. 1) in the substrate 100. In an example, a photolithography operation may form the cavity 120 defined in the substrate 100. For instance, a first photoresist material 400 (e.g., positive or negative photoresist) may be selectively coupled to (e.g., applied to) the substrate 100. A mask may be positioned proximate the substrate 100 to limit (e.g., prevent, inhibit, absorb, reflect, or the like) the exposure of the photoresist 400 to light in a specified pattern.

The substrate 100 may be exposed to a light source, and the photoresist 400 may absorb light where the light passes through the mask. The photoresist 400 may harden if exposed to light, for instance in the specified pattern defined by the mask. The photoresist 400 that is not exposed to the light may be removed from the substrate 100, and the hardened photoresist 400 may remain coupled to the substrate 100 to thereby define a cavity region 410. In this example, the photoresist 400 is coupled to the conductive layer 300 outside of the cavity region 410 because the photoresist 400 is cured by the light (e.g., a positive photoresist). The conductive layer 300 may be exposed (e.g., visible, accessible, or the like) within the cavity region 410 because the uncured photoresist 400 is removed from the substrate 100.

A protective layer 420 (e.g., nickel) may be coupled to the conductive layer 300 in the cavity region 410. In this example, because the conductive layer 300 is exposed within the cavity region 410, the protective layer 420 may be coupled to the conductive layer 300. The protective layer 420 may shield (e.g., insulate, preserve, shelter, inhibit, cover, or the like) the conductive layer 300 within the cavity region 410 from additional manufacturing operations.

Figure 5:
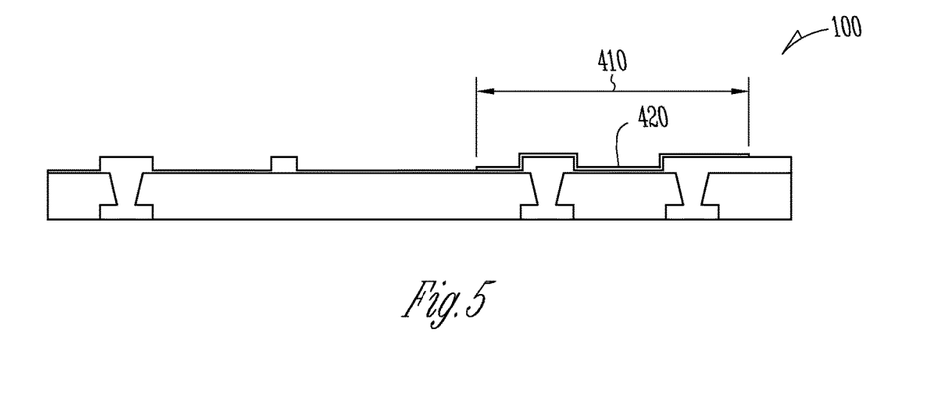
FIG. 5 is a schematic view of the substrate during yet another manufacturing operation.

FIG. 5 is a schematic view of the substrate 100 during yet another manufacturing operation. As described herein, and in one example, a photolithography operation may form the cavity 120 defined in the substrate 100. The photoresist 400 (shown in FIG. 4) may be removed from the substrate 100. For instance, a solvent (e.g., a developer) may dissolve the photoresist 400. In an example, the solvent may dissolve the hardened photoresist 400 that was exposed to light. In this example (and as shown in FIG. 5) when the photoresist is removed, the portion of the conductive layer 300 outside the cavity region 410 may be exposed. The protective layer 420 may remain coupled to the conductive layer 300 when the photoresist 400 is removed from the substrate 100.

Figure 6:
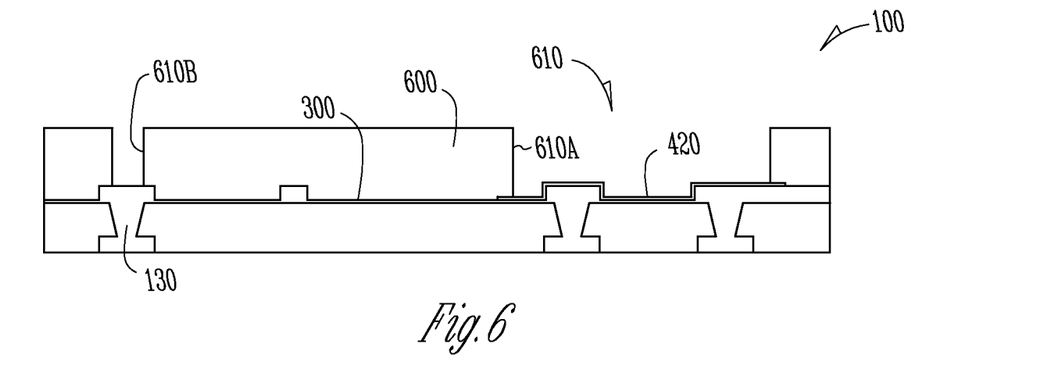
FIG. 6 is a schematic view of the substrate during still yet another manufacturing operation.

FIG. 6 is a schematic view of the substrate 100 during still yet another manufacturing operation. A second photoresist material 600 may be selectively coupled to the substrate 100, for instance in a specified pattern. In an example, the photoresist 600 may be coupled to the via 130, the conductive layer 300, and the protective layer 420. In some examples, the photoresist 600 shields the conductive layer 300.

The selective coupling of the photoresist 600 may expose the via 130 and the protective layer 420. One or more openings 610 may be defined in the photoresist 600. For example, a first opening 610A may expose the protective layer 420. A second opening 610B may expose the via 130.

Figure 7:
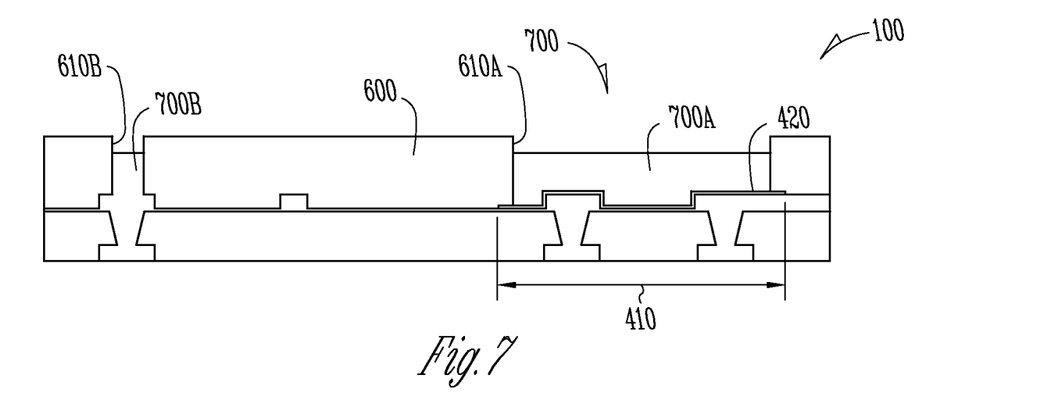
FIG. 7 is a schematic view of the substrate during a further manufacturing operation.

FIG. 7 is a schematic view of the substrate 100 during a further manufacturing operation. A filler material 700 may be coupled with the substrate 100. For instance, the filler material 700A may fill the opening 610A, and the filler material 700B may fill the opening 610B. The filler material 700 may include conductive material (e.g., copper) or non-conductive material (e.g., a dielectric material). In one example, the filler material 700 is a photoresist that does not dissolve with the same solvent as the photoresist 600. In this example, the photoresist 600 may be removed with a solvent, and the solvent will not dissolve the filler material 700 that includes a different photoresist. In another example, filler material 700 includes a conductive material (e.g., copper) and the filler material 700 may be plated into the openings 610A, 610B. In this example, the photoresist 600 may be removed with a solvent (e.g., developer), and the solvent does not dissolve the filler material 700.

As shown in FIG. 7, the photoresist 600 is positioned within (e.g., extends into) the cavity region 410. Accordingly, the photoresist 600 interfaces with the protective layer 420. The photoresist 600 may be positioned within the cavity region 410 to assist coupling the filler material 700A to the protective layer 420. For example, the positioning of the photoresist 600 within the cavity region 410 compensates for misalignment of the filler material 700A with respect to the protective layer 420, and helps position the filler material 700 within the cavity region 410. The area of the protective layer 420 within the cavity region 410 may be greater than the area of the filler material 700A within the cavity region 410. Accordingly, positioning the photoresist 600 within the cavity region 410 helps position the filler material 700A within the cavity region 410.

Figure 8:
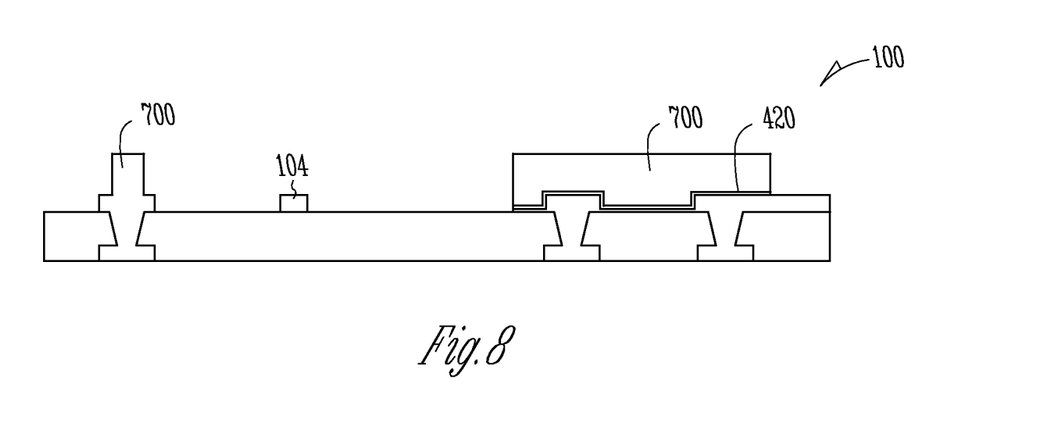
FIG. 8 is a schematic view of the substrate during an additional manufacturing operation.

FIG. 8 is a schematic view of the substrate 100 during an additional manufacturing operation. The photoresist 600 (shown in FIG. 7) may be removed from the substrate 100 (e.g., with a solvent, for instance a developer). Portions of the protective layer 420 that are not coupled to the filler material 700A may be removed (e.g., with a solvent). Portions of the conductive layer 300 may be removed (e.g., with a quick etch operation). The filler material 700A, 700B and the electrical trace 104 may remain coupled to the substrate 100 after removal of the photoresist 600, the protective layer 420, and the conductive layer 300. The filler material 700A may help define the cavity 120 in the substrate 100. The filler material 700B may be included in the via 130, and the filler material 700B may help transmit electrical signals between the plurality of layers 110 (e.g., between the layer 110A, 110B, or 110C shown in FIG. 10).

Figure 9:
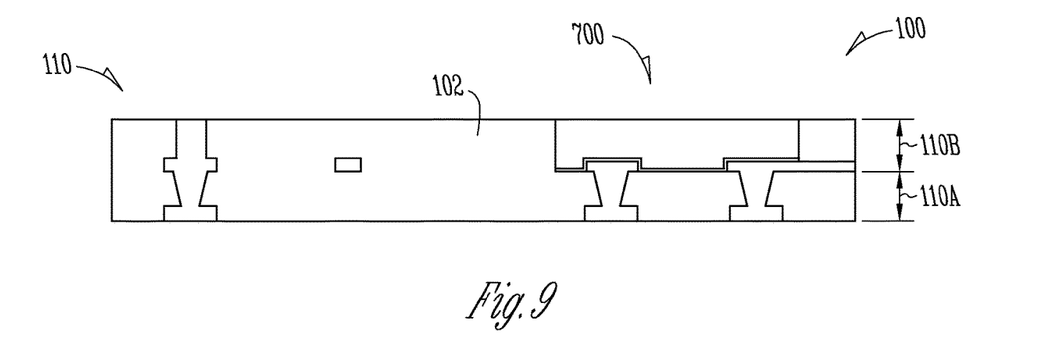
FIG. 9 is a schematic view of the substrate during another manufacturing operation.

FIG. 9 is a schematic view of the substrate 100 during another manufacturing operation. As described herein, the substrate 100 includes the plurality of layers 110. The filler material 700 may be included in the layer 110B. The layer 110B may include the dielectric material 102. In an example, the dielectric material 102 may be coupled to the layer 110A. The dielectric may be coupled to the filler material 700. In some examples, portions of the layer 110B are removed. For instance, the dielectric material 102 and the filler material 700 may be mechanically removed (e.g., ground), and a surface of the dielectric material 102 (e.g., a top surface) may be coplanar with a surface of the filler material 700.

Figure 10:
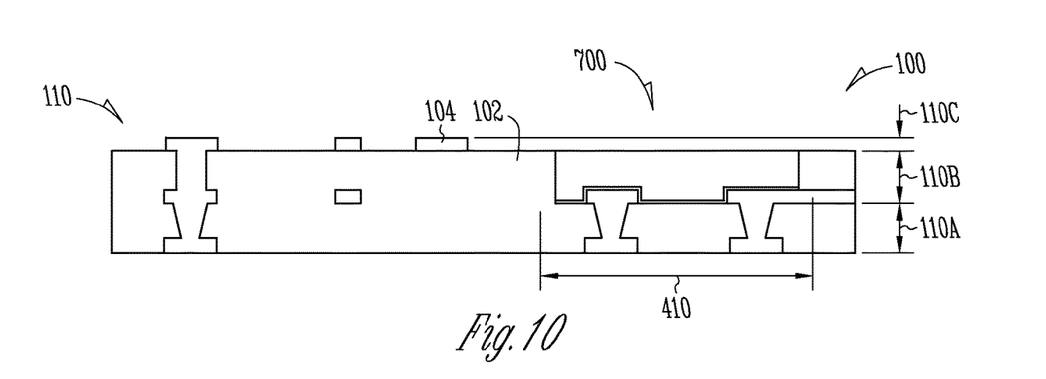
FIG. 10 is a schematic view of the substrate during yet another manufacturing operation.

FIG. 10 is a schematic view of the substrate 5 100 during yet another manufacturing operation. The substrate 100 may include a third layer 110C. The third layer 110C may be coupled to the substrate 100 (e.g., layer 110A or 110B). The layer 110C may include the dielectric material 102 and the electrical traces 104.

Figure 11:
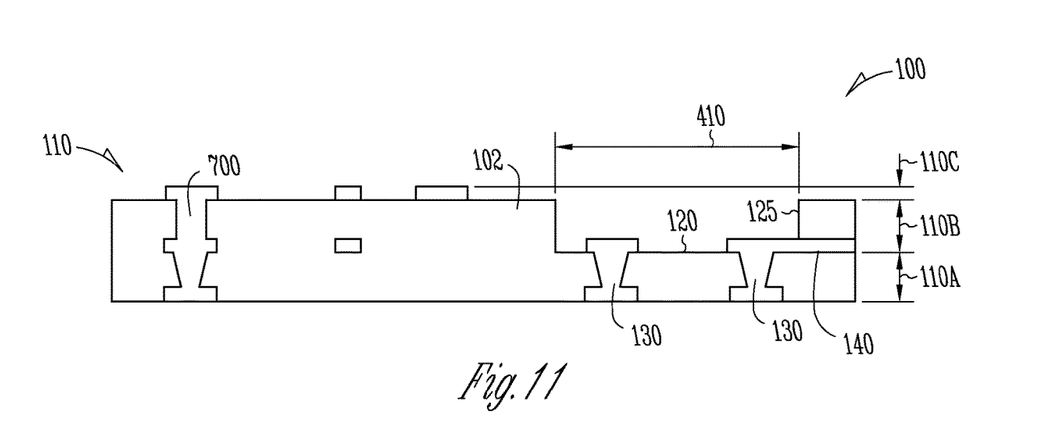
FIG. 11 is a schematic view of the substrate during still yet another manufacturing operation.

FIG. 11 is a schematic view of the substrate 100 during still yet another manufacturing operation. As described herein, the protective layer 420 (shown in FIGS. 4-8) may shield the conductive layer 300 within the cavity region 410 from additional manufacturing operations. For instance, the conductive layer 300 (shown in FIG. 6) may be etched with a solvent (e.g., an acid or the like). The solvent may etch the conductive layer 300 and the solvent may not etch the protective layer 420. In another example, the solvent may etch the conductive layer 300 at a greater rate than the protective layer 420. Accordingly, the conductive layer 300 is not etched by the solvent within the cavity region 410, because the conductive layer 300 is shielded by the protective layer 420.

The filler material 700 (e.g., copper) may be removed, and the protective layer 420 (e.g., nickel, titanium, tin, or the like) may prevent the further removal of material from the substrate 100 (e.g., the interconnects 310 or the lateral trace 140, shown in FIG. 3). Accordingly, the filler material 700 may be selectively removed from the substrate 100. The removal of the filler material 700 from the substrate 100 may form the cavity 120 in the substrate 100.

In an example, a first solvent may dissolve the filler material 700 (e.g., copper). In this example, when the first solvent dissolves the filler material 700 (e.g., the filler material 700A), the first solvent will communicate with the protective layer 420. The first solvent may not dissolve the protective layer 420 (e.g., nickel), and the first solvent will not remove additional material from the substrate 100 (e.g., the protective layer 410 may be configured as an etch stop).

A second solvent may be applied to the protective layer 420 and dissolve the protective layer 420. The second solvent may not dissolve the structures shielded by the protective layer 420 (e.g., the interconnects 310 or the lateral trace 140, shown in FIG. 3). The first solvent may be applied to the substrate 100, and the conductive layer 300 (shown in FIG. 3) between the vias 130 may be removed. Accordingly, the removal of the conductive layer 300 may electrically isolate the vias 130.

As described herein, the removal of the filler material 700 may form the cavity 120 defined by the substrate 100. In this example, the dielectric material 102 is coupled to the filler material 700A (shown in FIG. 9). Removal of the filler material 700 from the substrate 100 may form the cavity 120 defined in the substrate 100. The protective layer 420 (shown in FIGS. 4-8) may shield the lateral trace 140 during the removal of the filler material 700. Accordingly, the lateral trace 140 extends through the wall 125 of the cavity 120 because the lateral trace 140 is shielded (e.g., by the protective layer 120) during removal of the filler material 700 and formation of the cavity 120. Stated another way, the lateral trace 140 and the cavity 120 may be included in the same layer 110B of the substrate 100 while the lateral trace extends into a footprint of the cavity 120.

The lateral trace 140 facilitates interconnection with the electrical components 210 (shown in FIG. 2) within a footprint of the cavity 120. The lateral trace 140 facilitates the interconnection with the electrical components 210 in one or more directions (e.g., horizontally) with respect to the cavity 120. Accordingly, the lateral trace 140 increases the density of interconnections within the footprint of the cavity 120 because the lateral trace 140 may extend through sides of the cavity 120 (e.g., horizontally), and the vias 130 may extend through ends of the cavity 120 (e.g., vertically). The lateral trace 140 may extend perpendicular to the vias 130.

Figure 12:
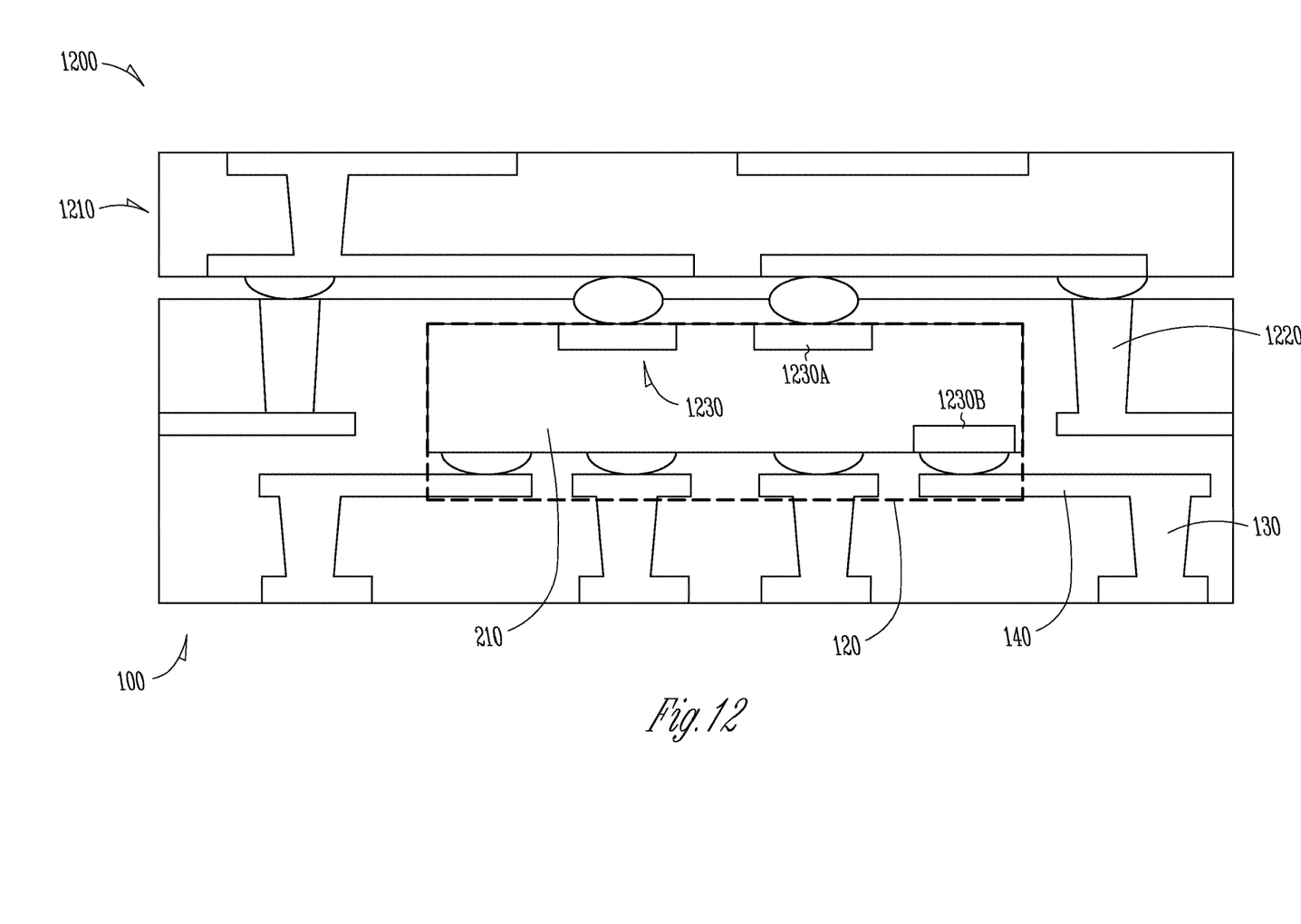
FIG. 12 is a schematic view of an example of a second electronic device.

FIG. 12 is a schematic view of an example of a second electronic device 1200. The electronic device 1200 may include a package-on-package ("POP") configuration. In an example, a POP substrate 1200 may be positioned proximate the substrate 100, and the POP substrate 1210 may be coupled to the substrate 100 (e.g., with one or more solder balls). The POP substrate 1210 may be coupled to a surface (e.g., a top surface) of the substrate 100. For instance, the substrate 100 may include a via 1220, and the via 1220 may be exposed on a surface of the substrate 100. The POP substrate may be coupled to the via 1220, and one or more electrical signals may be transmitted between the POP substrate 1210 and the substrate 100. Additional structures (e.g., substrates or electrical components) may be coupled to the electronic device 1210, for instance to provide a system-on-a-chip.

As previously described herein, the substrate 100 may include the lateral trace 140. The substrate 100 may define the cavity 120, and the lateral trace 140 may extend into cavity 120. The electrical component 210 (e.g., a die, a resistor, a capacitor, a transistor, or the like) may be positioned in the cavity and coupled with the lateral trace 140. The lateral trace 140 may facilitate the electrical communication of the electrical component 210 with the substrate 100.

The electronic device 1200 includes one or more electrical communication pathways between the substrate 100 and the POP substrate 1210. As described herein, the via 1220 may be coupled to the POP substrate 1210. In another example, the electrical component 210 is a semiconductor die (e.g., a through-silicon via die). The electrical component 210 may include interconnects 1230 on a plurality of sides of the component 210. For instance, a first interconnect 1230A may be positioned on a first side of the electrical component 210, and a second interconnect 1230B may be included on a second side of the electrical component 210. The interconnects 1230 may be exposed on a surface of the substrate 100. The POP substrate 1210 may be coupled to the electrical component 210. An electrical signal may be transmitted from the lateral trace 140, through the electrical component 1230, and to the POP substrate 1210.

Figure 13:
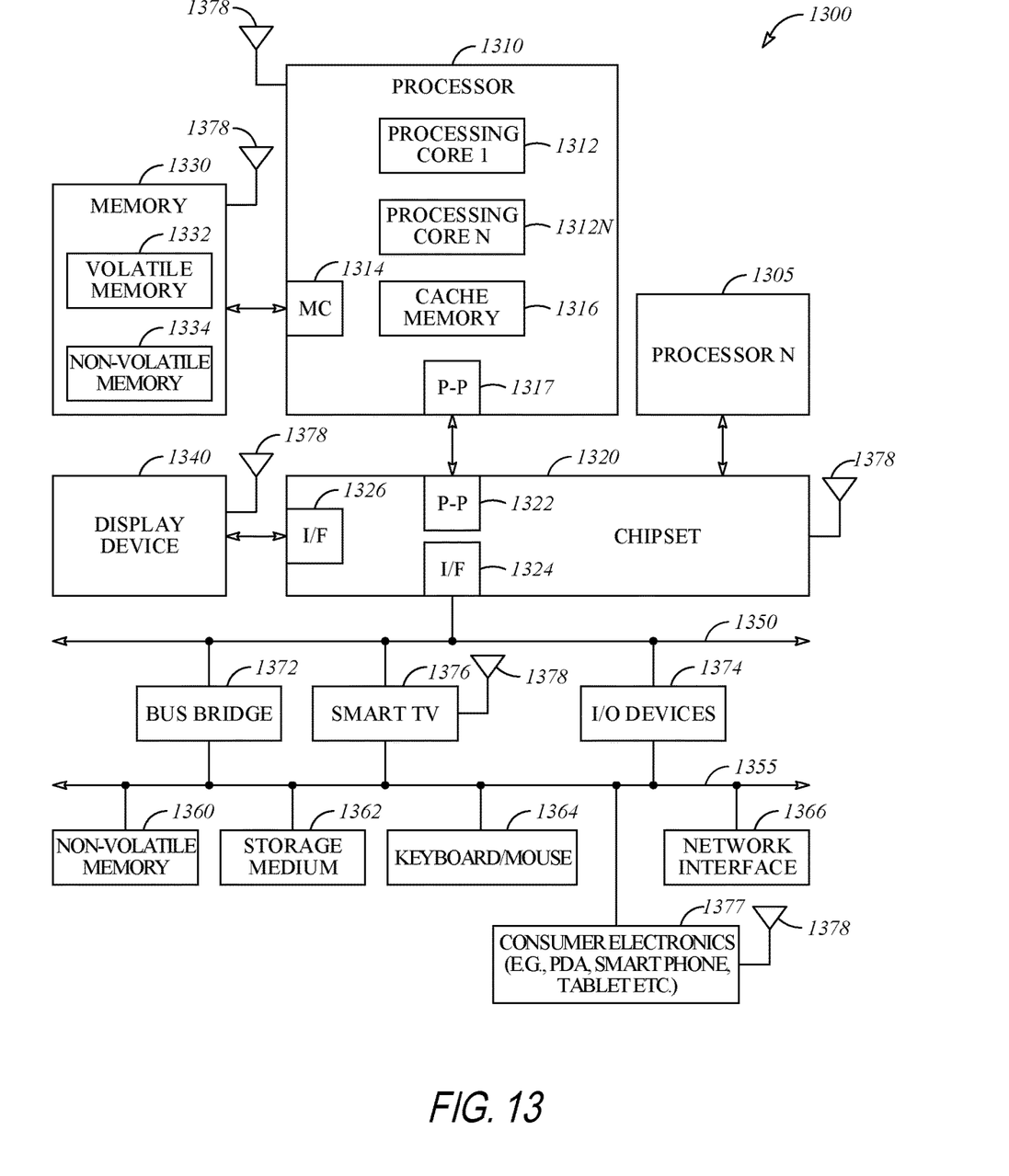
FIG. 13 illustrates a system level diagram, depicting an example of an electronic device (e.g., system).

FIG. 13 illustrates a system level diagram, depicting an example of an electronic device (e.g., system) including the electronic device 200 or the electronic device 1200 as described in the present disclosure. FIG. 13 is included to show an example of a higher level device application for the electronic device 200 or the electronic device 1200. In one embodiment, system 1300 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 1300 is a system on a chip (SOC) system.

In one embodiment, processor 1310 has one or more processor cores 1312 and 1312N, where 1312N represents the Nth processor core inside processor 1310 where N is a positive integer. In one embodiment, system 1300 includes multiple processors including 1310 and 1305, where processor 1305 has logic similar or identical to the logic of processor 1310. In some embodiments, processing core 1312 includes, but is not limited to, pre-fetch logic to fetch instructions, decode logic to decode the instructions, execution logic to execute instructions and the like. In some embodiments, processor 1310 has a cache memory 1316 to cache instructions and/or data for system 1300. Cache memory 1316 may be organized into a hierarchal structure including one or more levels of cache memory.

In some embodiments, processor 1310 includes a memory controller 1314, which is operable to perform functions that enable the processor 1310 to access and communicate with memory 1330 that includes a volatile memory 1332 and/or a non-volatile memory 1334. In some embodiments, processor 1310 is coupled with memory 1330 and chipset 1320. Processor 1310 may also be coupled to a wireless antenna 1378 to communicate with any device configured to transmit and/or receive wireless signals. In one embodiment, an interface for wireless antenna 1378 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 1332 includes, but is not limited to, Synchronous Dynamic Random Access Memory (SDRAM), Dynamic Random Access Memory (DRAM), RAIVIBUS Dynamic Random Access Memory (RDRAM), and/or any other type of random access memory device. Non-volatile memory 1334 includes, but is not limited to, flash memory, phase change memory (PCM), read-only memory (ROM), electrically erasable programmable read-only memory (EEPROM), or any other type of non-volatile memory device.

Memory 1330 stores information and instructions to be executed by processor 1310. In one embodiment, memory 1330 may also store temporary variables or other intermediate information while processor 1310 is executing instructions. In the illustrated embodiment, chipset 1320 connects with processor 1310 via Point-to-Point (PtP or P-P) interfaces 1317 and 1322. Chipset 1320 enables processor 1310 to connect to other elements in system 1300. In some embodiments of the example system, interfaces 1317 and 1322 operate in accordance with a PtP communication protocol such as the Intel® QuickPath Interconnect (QPI) or the like. In other embodiments, a different interconnect may be used.

In some embodiments, chipset 1320 is operable to communicate with processor 1310, 1305N, display device 1340, and other devices, including a bus bridge 1372, a smart TV 1376, I/O devices 1374, nonvolatile memory 1360, a storage medium (such as one or more mass storage devices) 1362, a keyboard/mouse 1364, a network interface 1366, and various forms of consumer electronics 1377 (such as a PDA, smart phone, tablet etc.), etc. In one embodiment, chipset 1320 couples with these devices through an interface 1324. Chipset 1320 may also be coupled to a wireless antenna 1378 to communicate with any device configured to transmit and/or receive wireless signals.

Chipset 1320 connects to display device 1340 via interface 1326. Display 1340 may be, for example, a liquid crystal display (LCD), a plasma display, cathode ray tube (CRT) display, or any other form of visual display device. In some embodiments of the example system, processor 1310 and chipset 1320 are merged into a single SOC. In addition, chipset 1320 connects to one or more buses 1350 and 1355 that interconnect various system elements, such as I/O devices 1374, nonvolatile memory 1360, storage medium 1362, a keyboard/mouse 1364, and network interface 1366. Buses 1350 and 1355 may be interconnected together via a bus bridge 1372.

In one embodiment, mass storage device 1362 includes, but is not limited to, a solid state drive, a hard disk drive, a universal serial bus flash memory drive, or any other form of computer data storage medium. In one embodiment, network interface 1366 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 13 are depicted as separate blocks within the system 1300, the functions performed by some of these blocks may be integrated within a single semiconductor circuit or may be implemented using two or more separate integrated circuits. For example, although cache memory 1316 is depicted as a separate block within processor 1310, cache memory 1316 (or selected aspects of 1316) can be incorporated into processor core 1312.

VARIOUS NOTES & EXAMPLES

Aspect 1 may include or use subject matter (such as an apparatus, a system, a device, a method, a means for performing acts, or a device readable medium including instructions that, when performed by the device, may cause the device to perform acts, or an article of manufacture), such as may include or use an electronic device, comprising: a substrate including one or more layers, the one or more layers including a first dielectric material and one or more electrical traces; a cavity defined in the substrate and adapted to receive one or more electrical components; and one or more lateral traces extending through a wall of the cavity, wherein the one or more lateral traces are configured to provide electrical communication pathways between the substrate and the one or more electrical components.

Aspect 2 may include or use, or may optionally be combined with the subject matter of Aspect 1, to optionally include or use a via configured to facilitate the electrical communication between the one or more layers of the substrate, wherein at least one of the one or more lateral traces is in electrical communication with the via, and the at least one lateral trace extends perpendicular to the via.

Aspect 3 may include or use, or may optionally be combined with the subject matter of Aspect 2 to optionally include or use wherein the via is positioned within a footprint of the cavity.

Aspect 4 may include or use, or may optionally be combined with the subject matter of one or any combination of Aspects 1 through 3 to optionally include or use wherein the at least one lateral trace extending perpendicular to the via is coplanar with a portion of a via.

Aspect 5 may include or use, or may optionally be combined with the subject matter of one or any combination of Aspects 1 through 4 to optionally include or use an electrical pad adapted to couple with the electrical component.

Aspect 6 may include or use, or may optionally be combined with the subject matter of one or any combination of Aspects 1 through 5 to optionally include or use wherein: the one or more electrical components includes a semiconductor die, the semiconductor die is positioned in the cavity defined by the substrate, and the semiconductor die is in electrical communication with the lateral trace.

Aspect 7 may include or use, or may optionally be combined with the subject matter of one or any combination of Aspects 1 through 6 to optionally include or use wherein the electronic components includes active electronic components or passive electronic components.

Aspect 8 may include or use, or may optionally be combined with the subject matter of one or any combination of Aspects 1 through 7 to optionally include or use a plurality of interconnects positioned in the cavity and configured to couple with the one or more electrical components, and wherein at least one of the one or more lateral traces is in communication with at least one of the plurality of interconnects.

Aspect 9 may include or use subject matter (such as an apparatus, a system, a device, a method, a means for performing acts, or a device readable medium including instructions that, when performed by the device, may cause the device to perform acts, or an article of manufacture), such as may include or use an electronic device, comprising: a substrate including one or more layers, the one or more layers including a first dielectric material and one or more electrical traces; a first cavity defined in the substrate and adapted to receive one or more electrical components; a first lateral trace extending through a wall of the first cavity, wherein the first lateral trace is configured to provide electrical communication pathways between the substrate and the one or more electrical components; a first semiconductor die positioned in the first cavity defined in the substrate, and wherein the first semiconductor die is embedded in the substrate; and a second semiconductor die positioned on a surface of the substrate, wherein the first semiconductor die and the second semiconductor die are in electrical communication through the substrate.

Aspect 10 may include or use, or may optionally be combined with the subject matter of Aspect 9, to optionally include or use a second cavity defined in the substrate and adapted to receive the one or more electrical components; and a third semiconductor die positioned in the second cavity defined in the substrate, and wherein the third semiconductor die is embedded in the substrate.

Aspect 11 may include or use, or may optionally be combined with the subject matter of Aspect 10 to optionally include or use a second lateral trace extending through a wall of the second cavity, wherein the second lateral trace is configured to provide electrical communication pathways between the substrate and the one or more electrical components.

Aspect 12 may include or use, or may optionally be combined with the subject matter of one or any combination of Aspects 10 or 11 to optionally include or use wherein the first lateral trace extends through a wall of the second cavity, and the first lateral trace electrically interconnects the first semiconductor die and the third semiconductor die.

Aspect 13 may include or use, or may optionally be combined with the subject matter of one or any combination of Aspects 10 through 12 to optionally include or use wherein a portion of the third semiconductor die is coplanar with a portion of the first semiconductor die.

Aspect 14 may include or use, or may optionally be combined with the subject matter of one or any combination of Aspects 9 through 13 to optionally include or use wherein the first semiconductor die is positioned within a footprint of the second semiconductor die.

Aspect 15 may include or use, or may optionally be combined with the subject matter of one or any combination of Aspects 9 through 14 to optionally include or use a first via coupled to a first side of the first semiconductor die, and a second via coupled to a second side of the first semiconductor die.

Aspect 16 may include or use subject matter (such as an apparatus, a system, a device, a method, a means for performing acts, or a device readable medium including instructions that, when performed by the device, may cause the device to perform acts, or an article of manufacture), such as may include or use an electronic device, comprising: a first substrate including one or more layers, the one or more layers including a first dielectric material and one or more electrical traces; a cavity defined in the first substrate and adapted to receive one or more electrical components; one or more lateral traces extending through a wall of the cavity, wherein the one or more lateral traces are configured to provide electrical communication pathways between the first substrate and the one or more electrical components; a semiconductor die positioned in the cavity defined in the first substrate, and wherein the semiconductor die is embedded in the first substrate; and a second substrate including one or more layers, the one or more layers including a second dielectric material and one or more electrical traces, wherein the second substrate is coupled to the first substrate in a package-on-package configuration.

Aspect 17 may include or use, or may optionally be combined with the subject matter of Aspect 16, to optionally include or use wherein: the semiconductor die is directly coupled to the second substrate, and the semiconductor die is in electrical communication with the second substrate.

Aspect 18 may include or use, or may optionally be combined with the subject matter of one or any combination of Aspects 16 or 17 to optionally include or use a first via laterally offset from the semiconductor die, and wherein at least one of the one or more lateral traces provides an electrical communication pathway between the semiconductor die and the first via.

Aspect 19 may include or use, or may optionally be combined with the subject matter of Aspect 18 to optionally include or use a second via offset from the first via, and wherein a portion of the second via is coplanar with a portion of the semiconductor die.

Aspect 20 may include or use, or may optionally be combined with the subject matter of one or any combination of Aspects 18 or 19 to optionally include or use a second via positioned within a footprint of the semiconductor die.

Aspect 21 may include or use, or may optionally be combined with any portion or combination of any portions of any one or more of Aspects 1 through 20 to include or use, subject matter that may include means for performing any one or more of the functions of Aspects 1 through 20, or a machine-readable medium including instructions that, when performed by a machine, cause the machine to perform any one or more of the functions of Aspects 1 through 20.

Each of these non-limiting examples may stand on its own, or may be combined in various permutations or combinations with one or more of the other examples.

The above description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. An electronic device, comprising:
   a substrate including one or more layers, the one or more layers including a first dielectric material and one or more electrical traces;
   a first cavity defined in the substrate and adapted to receive one or more electrical components;
   a second cavity defined in the substrate and adapted to receive the one or more electrical components;
   a first lateral trace extending through a wall of the first cavity, wherein the first lateral trace is configured to provide electrical communication pathways between the substrate and the one or more electrical components;
   a first semiconductor die positioned in the first cavity defined in the substrate, and wherein the first semiconductor die is embedded in the substrate;
   a second semiconductor die positioned on a surface of the substrate, wherein the first semiconductor die and the second semiconductor die are in electrical communication through the substrate;
   a third semiconductor die positioned in the second cavity defined in the substrate, and wherein the third semiconductor die is embedded in the substrate; and
   wherein the first lateral trace extends through a wall of the second cavity, and the first lateral trace electrically interconnects the first semiconductor die and the third semiconductor die.

2. The electronic device of claim 1, further comprising a second lateral trace extending through a wall of the second cavity, wherein the second lateral trace is configured to provide electrical communication pathways between the substrate and the one or more electrical components.

3. The electronic device of claim 1, wherein a portion of the third semiconductor die is coplanar with a portion of the first semiconductor die.

4. The electronic device of claim 1, wherein the first semiconductor die is positioned within a footprint of the second semiconductor die.

5. The electronic device of claim 1, further comprising a first via coupled to a first side of the first semiconductor die, and a second via coupled to a second side of the first semiconductor die.

6. The electronic device of claim 1, further comprising:
   a via configured to facilitate the electrical communication between the one or more layers of the substrate; and
   a second lateral trace in electrical communication with the via, wherein the second lateral trace extends perpendicular to the via.

7. The electronic device of claim 6, wherein the via is positioned within a footprint of the first cavity.

8. The electronic device of claim 6, wherein the second lateral trace is coplanar with a portion of a via.

9. The electronic device of claim 1, further comprising a plurality of interconnects positioned in the first cavity and configured to couple with the first semiconductor die, and wherein one or more of the first lateral trace or a second lateral trace are in communication with at least one of the plurality of interconnects.

* * * * *